(12) United States Patent
Kim et al.

(10) Patent No.: US 8,797,753 B2
(45) Date of Patent: Aug. 5, 2014

(54) AUDIO AND VIDEO REPRODUCTION APPARATUS HAVING MAIN BOARD ON WHICH SURFACE MOUNT TYPE CONNECTORS ARE MOUNTED

(75) Inventors: Sung-soo Kim, Suwon-si (KR); Jong-hee Han, Yongin-si (KR); Il-ki Min, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1077 days.

(21) Appl. No.: 12/705,719

(22) Filed: Feb. 15, 2010

(65) Prior Publication Data
US 2010/0321354 A1  Dec. 23, 2010

(30) Foreign Application Priority Data

Jun. 23, 2009  (KR) .................. 10-2009-0055934

(51) Int. Cl.
*H05K 7/02* (2006.01)
*H05K 7/06* (2006.01)
*H05K 7/08* (2006.01)
*H05K 7/10* (2006.01)

(52) U.S. Cl.
USPC ............ 361/760; 361/679.23; 361/679.3; 361/764; 361/784

(58) Field of Classification Search
USPC ................. 361/679.23, 679.3, 679.56, 361/679.6–679.61
See application file for complete search history.

(56) References Cited

U.S. PATENT DOCUMENTS

| | | | | |
|---|---|---|---|---|
| 6,065,080 A | * | 5/2000 | Alpert | 710/301 |
| 7,525,602 B2 | * | 4/2009 | Yamamoto | 348/725 |
| 2004/0012934 A1 | * | 1/2004 | Jafari et al. | 361/760 |
| 2008/0050921 A1 | * | 2/2008 | Miyairi et al. | 438/703 |

FOREIGN PATENT DOCUMENTS

JP      2005-26246 A    1/2005

* cited by examiner

*Primary Examiner* — Tuan T Dinh
(74) *Attorney, Agent, or Firm* — Sughrue Mion, PLLC

(57) ABSTRACT

Provided is a video and audio reproduction apparatus including a display unit; a speaker unit; a main board; and a power supply unit, and the main board includes a printed circuit board; a first connector area which is formed on a front side of the printed circuit board; a second connector area which is formed on the front side of the printed circuit board; and a main chip which is surface-mounted on a back side of the printed circuit board.

23 Claims, 5 Drawing Sheets

AUDIO AND VIDEO REPRODUCTION APPARATUS HAVING MAIN BOARD ON WHICH SURFACE MOUNT TYPE CONNECTORS ARE MOUNTED

CROSS-REFERENCE TO RELATED APPLICATIONS

This application claims priority under 35 U.S.C. §119 from Korean Patent Application No. 10-2009-55934, filed on Jun. 23, 2009, in the Korean Intellectual Property Office, the disclosure of which is incorporated herein by reference in its entirety.

BACKGROUND OF THE INVENTION

1. Field of the Invention

Apparatuses and methods consistent with the present invention relate to an audio and video reproduction apparatus, and more particularly, to an audio and video apparatus having a main board on which surface mount type connectors are mounted.

2. Description of the Related Art

In general, various connectors are mounted on a printed circuit board of a main board of an audio and video reproduction apparatus. These connectors connect to an external apparatus and are used to facilitate communication of a video/audio signal between the external apparatus and the reproduction apparatus. However, most of these connectors are made of DIP-type material and require an additional manufacturing step of creating a through hole on the printed circuit board, thereby increasing production cost and complicating the manufacturing process. In addition, if a DIP-type connector is mounted on one side of the printed circuit board, additional parts may not be mounted on the other side of the substrate, and thus those additional parts need to be mounted at another location. As a result, the size of the main board increases as every area of the printed circuit board is not used efficiently. Furthermore, the cost of the reproduction apparatus also increases as a larger printed circuit board is required.

In order to address the above issues, there needs to be an effort to improve connectors mounted on the printed circuit board.

SUMMARY OF THE INVENTION

Exemplary embodiments of the present invention address at least the above problems and/or disadvantages and other disadvantages not described above. Also, the present invention is not required to overcome the disadvantages described above, and an exemplary embodiment of the present invention may not overcome any of the problems described above.

Exemplary embodiments of the present invention provides a video and audio reproduction apparatus having a main board which is small, requires less production cost and simplifies production cost by using a surface mount type connector.

A video and audio reproduction apparatus, according to an exemplary embodiment of the present invention, comprises a display unit which displays an image, a speaker unit which outputs audio, a main board which controls the display unit and the speaker unit, and is connected to an external apparatus which transmits a video signal and an audio signal, and a power supply unit which supplies a power to the display unit, a power to the speaker unit, and a power to the main board. The main board comprises a printed circuit board, a first connector area which is formed on a front side of the printed circuit board, wherein a plurality of external connection connectors are surface-mounted on the first connector area for connection with the external apparatus, a second connector area which is formed on the front side of the printed circuit board, wherein a plurality of internal connection connectors are surface-mounted on the second connector area for connection with the display unit, the speaker unit, and the power supply unit, and a main chip which is electrically connected to the external connection connectors and the internal connection connectors, and outputs processed video and processed audio by performing signal processing on the video signal and audio signal, the main chip being surface-mounted on a back side of the printed circuit board. The first connector area is disposed close to a first edge of the printed circuit board and the second connector area is disposed close to a second edge of the printed circuit board.

The second edge may be an opposite side of the first edge.

The second edge may be adjacent to the first edge.

The main chip may be surface-mounted on an area corresponding to the first connector area in the back side of the printed circuit board.

The main chip may be surface-mounted between the first connector area and the second connector area in the back side of the printed circuit board.

The internal connection connectors may be surface-mounted on the second connector area in a row.

The internal connection connectors may include at least two of an electrical power connector to receive electricity from the power supply unit, a speaker connector to output a signal-processed audio signal to the speaker unit, and a display interface connector to output a signal-processed video signal to the display unit.

The external connection connectors may be surface-mounted on the first connector area in a plurality of rows.

The external connection connectors may include at least two of a HMDI input connector, a PC data input connector, a headphone output connector, a USB connector, a component input connector, an audio input connector, a PC audio input connector, a tuner, a second audio input connector, and an optical connector.

More than two pattern layers may be formed between the front side and the back side of the printed circuit board.

Each of a plurality of circuit elements may be surface-mounted on the main board.

A video and audio reproduction apparatus, according to another exemplary embodiment of the present invention, comprises a display unit which displays an image, a speaker unit which outputs audio, a main board comprising a plurality of circuit elements, the main board receiving a video signal and an audio signal provided from an external apparatus, outputting a signal-processed video signal to the display unit to display the image, and outputting a signal-processed audio signal to the speaker unit to output the audio, and a power supply unit comprising a plurality of power supply circuit elements, the power supply unit receiving a main power from an outside source and supplying a power to the display unit, supplying a power to the speaker unit, and supplying a power to the main board. The main board comprises a printed circuit board having a front side and a back side, wherein an external connection connector module comprises a plurality of connectors which are connected with the external apparatus and receive the video and audio signal respectively or simultaneously, a tuner module which receives an external broadcasting signal, and an internal connection connector module comprising a plurality of connectors to be connected with each of the display unit, the speaker unit, and the power supply unit, and the external connection module and internal connection module are each surface-mounted on the front side of the printed circuit board, and a main chip, electrically connected with each of the external connection connector module and the internal connection connector module is surface-mounted on the back side of the printed circuit board.

In the printed circuit board, the external connection connector module may be surface-mounted on a first connector area close to a first edge, and the internal connection connector module may allow the image to be displayed on the display unit, allow the audio to be output on the speaker unit, and allow power to be supplied from the power to be supplied to the display unit, supplied to the speaker unit and supplied to the main board. The internal connection connector module may be surface-mounted on a second connector area close to a second edge, the second edge having a different location from the first edge, and the tuner module may be surface-mounted between the first connector area and the second connector area.

The external connection connector module may comprise at least two of a HMDI input connector, a PC data input connector, a headphone output connector, a USB connector, a component input connector, an audio input connector, a PC audio input connector, a tuner, a second audio input connector, and an optical connector.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF EXEMPLARY EMBODIMENTS OF THE INVENTION

Figure 1:
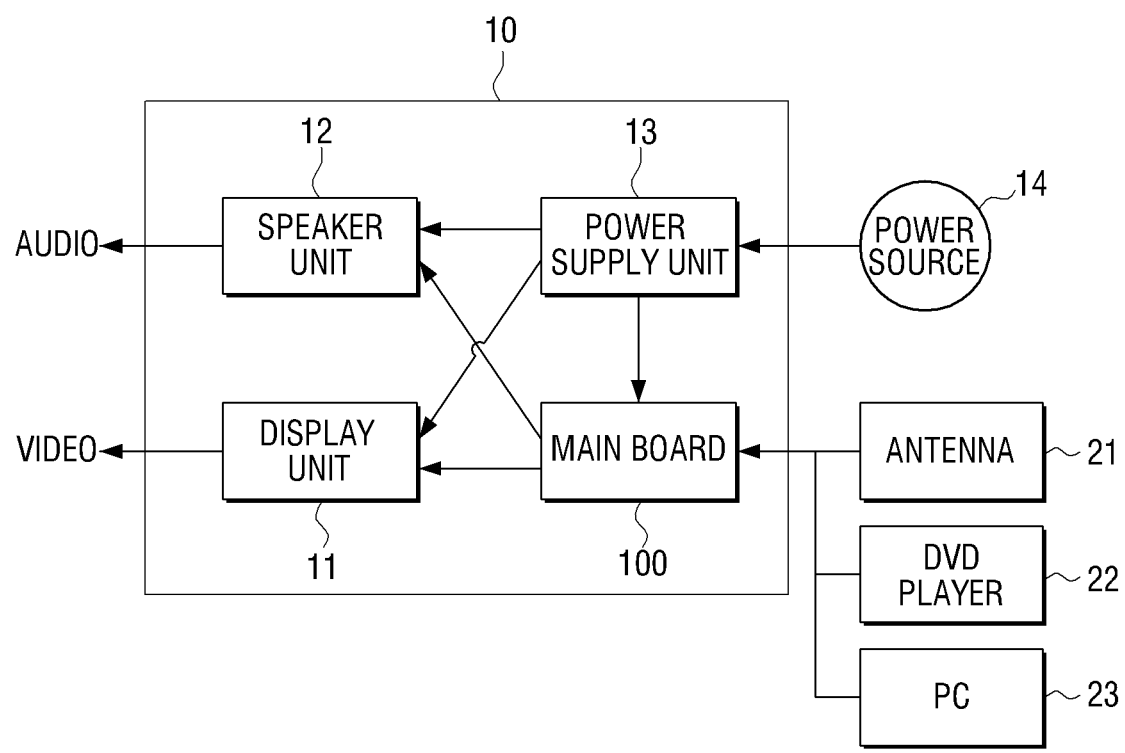
FIG. 1 is a view illustrating a video and audio reproduction apparatus, according to an exemplary embodiment of the present invention.

Certain exemplary embodiments of the present invention will now be described in greater detail with reference to the accompanying drawings.

In the following description, the same drawing reference numerals are used for the same elements, even in different drawings. The matters defined in the description, such as detailed construction and elements, are provided to assist in a comprehensive understanding of the invention. Thus, it is apparent that the present invention can be carried out without those specifically defined matters. Also, well-known functions or constructions are not described in detail since they would obscure the invention with unnecessary detail. Expressions such as "at least one of," when preceding a list of elements, modifies the entire list of elements and do not modify each element of the list.

FIG. 1 is a view illustrating a video and audio reproduction apparatus 10, according to an exemplary embodiment of the present invention. An exemplary embodiment of the video and audio reproduction apparatus 10 includes a digital television. The video and audio reproduction apparatus 10, according to an exemplary embodiment of the present invention, comprises a display unit 11, a speaker unit 12, a power supply unit 13, and a main board 100.

The display unit 11 receives a video signal from the main board 100 and displays an image.

The speaker unit 12 receives an audio signal from the main board and outputs an audio.

The power supply unit 13 supplies power to the display unit 11, the speaker unit 12, and the main board 100. The power supply unit 13 may be connected to an external power source 14. In addition, the power supply unit 13, which includes a battery, may supply power to the display unit 11, the speaker unit 13, and the main board 100 without the external power source 14. In order for the above function, a plurality of power supply circuit elements may be mounted on the power supply unit 13.

The main board 100 controls the display unit 11 and the speaker unit 12. In addition, the main board is connected to various external apparatuses transmitting a video and audio signal. As illustrated in FIG. 1, the external apparatuses may be an antenna 21, a DVD player 22, or a PC 23. However, these are only examples, and any apparatus transmitting a video signal and audio signal may be used as the external apparatus.

The main board 100 is connected to the external apparatuses 21, 22, 23 via external connection connectors 201-210 (see FIG. 2) which will be explained later. Since there are various transmission standards for an external apparatus, various connectors 201-210 (see FIG. 2) are mounted on the main board 100. In addition, the main board 100 is connected to the display unit 11, the speaker unit 12 and the power supply unit 13, which are internal parts of the video and audio reproduction apparatus 10, via the internal connection connectors 211-214 (see FIG. 2) which will be explained later.

The main board 100 receives a video and audio signal transmitted from the external apparatuses 21-23 via the external connection connectors 201-210, and performs signal processing on the received video and audio signal. The main board 100 outputs the processed video and audio signal to the display unit 11 and the speaker unit 12 respectively via the internal connection connectors 211-214. In order for the above function, a plurality of circuit elements are mounted on the main board 100.

Figure 2:
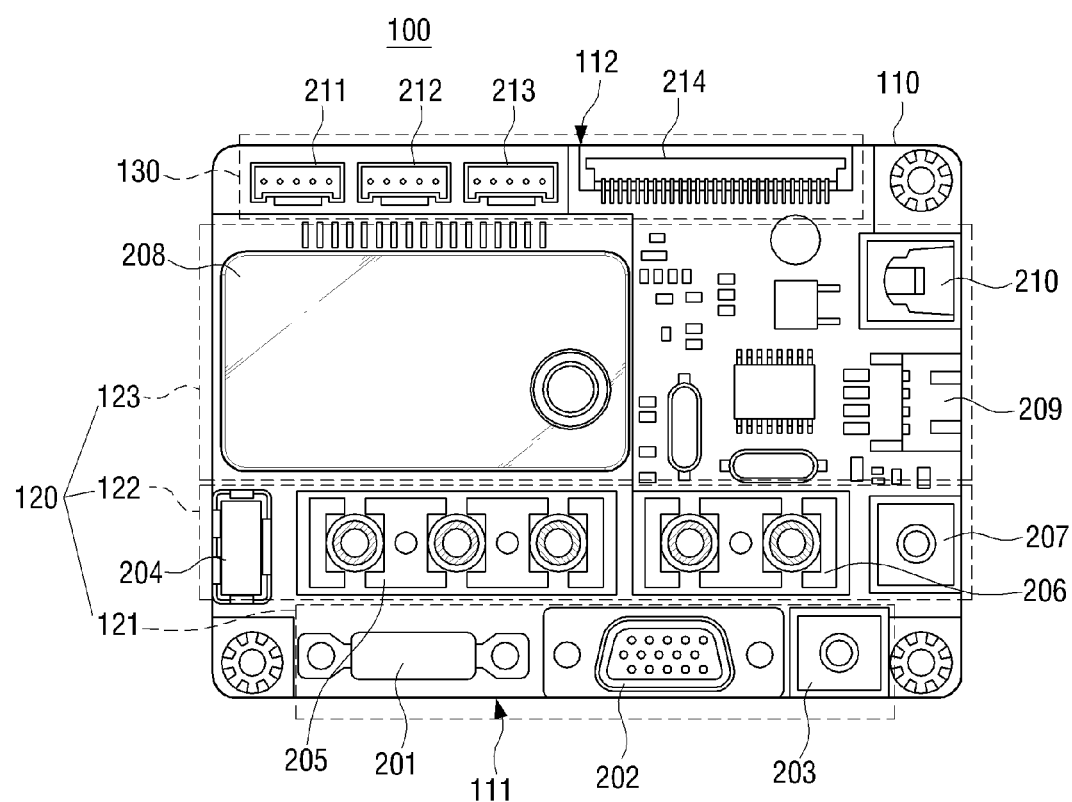
FIG. 2 is a view illustrating the front side of the main board in FIG. 1.
Figure 3:
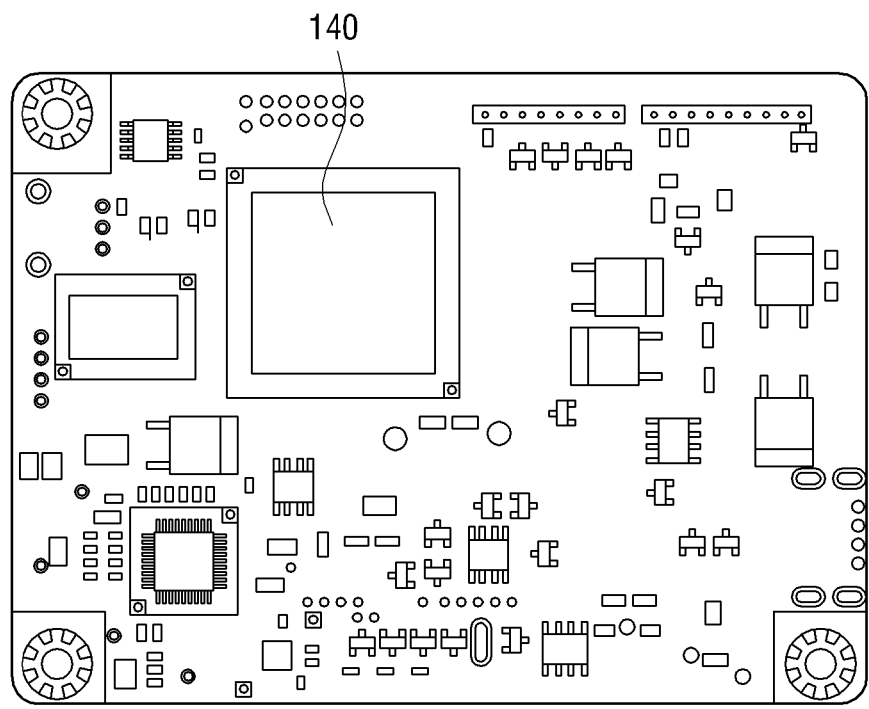
FIG. 3 is a view illustrating the back side of the main board in FIG. 1.
Figure 4:
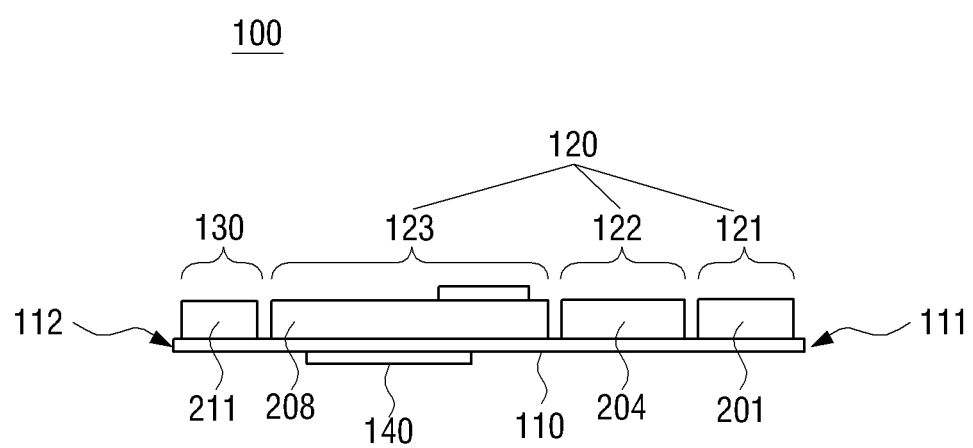
FIG. 4 is a view illustrating the side of the main board in FIG. 1.

Hereinafter, the main board 100 will be explain in greater detail with reference FIGS. 2-4. FIG. 2 is a view illustrating the front side of the main board 100 in FIG. 1, FIG. 3 is a view illustrating the back side of the main board 100 in FIG. 1, and FIG. 4 is a view illustrating the side of the main board 100 in FIG. 1. In FIG. 1, the front side of the main board 100 is towards the external apparatuses 21, 22, 23, and the back side of the main board is towards the display unit 11. That is, if the direction in which an image is output is defined to be the front side of the display unit 11, the back side of the main board 100 and the back side of the display unit face each other.

The main board, according to an exemplary embodiment of the present invention, comprises a printed circuit board 110, a first connector area 120, a second connector area 130, and a main chip 140.

Various circuit elements including the main chip 140 and the connectors 201-214 are mounted on the printed circuit board 110 as illustrated in FIGS. 2-4.

The first connector area 120 is formed on the front side of the printed circuit board 110 as illustrated in FIG. 2 and FIG. 4. The external connection connectors 201-210 are surface-mounted on the first connector area 120 for connection with the external apparatuses 21, 22, 23.

The external connection connectors 201-210 may be a HMDI input connector 201, a PC data input connector 202, a headphone output connector 203, a USB connector 204, a component input connector 205, a first audio input connector 206, a PC audio input connector 207, a tuner for receiving a external broadcasting signal 208, a second audio input connector 209, and an optical connector 210 as illustrated in FIG. 2. The above external connection connectors 201-210 form a single connector module for external connection, but the above connectors are only examples. Other connectors may be used other then the above-mentioned connectors.

The second connector area 130 is formed on the front side of the printed circuit board 110 as illustrated in FIG. 2 and FIG. 4. The internal connection connectors 211-214 are surface-mounted on the second connector area 130 for connection with the display unit 11, the speaker unit 12, and the power supply unit 13, which are internal parts of the video and audio reproduction apparatus 10.

As illustrated in FIG. 2, the internal connection connectors 211-213 may be an electrical power connector 211 for connection with the power supply unit 13, a function-key connector 212 for communication of a function signal of the video and audio reproduction apparatus 10 such as volume and channel adjustment, a speaker connector 213 for connection with the speaker unit 12, and a display interface connector for connection with the display unit 11. These internal connection connectors 211-213 form a single connector module for internal connection.

Other components except for the display unit 11, the speaker unit 12, and the power supply unit 13 which were mentioned above as internal components of the video and audio reproduction apparatus 10 may be connected to the main board 100. In this case, additional internal connection connectors other than the internal connection connectors 211-214 mentioned above may be surface-mounted on the second connector area 130.

The main chip 140 is surface-mounted on the back side of the printed circuit board 110 as illustrated in FIG. 3 and FIG. 4 and controls overall operation of a reproduction/recording apparatus. In addition, the main chip 140 is electrically connected to the external connection connectors 201-210 and internal connection connectors 211-214, and for this, a via hole (not shown) is formed on the printed circuit board 110.

The size of a main board is greatly affected by various connectors and a main chip. Most connectors are DIP-type connectors, and if these DIP-type connectors are mounted on the front side of a main board, it is impossible to mount other components on the back side of the main board. However, according to the exemplary embodiment of the present invention, all connectors 201-215 are surface-mounted on the front side of the printed circuit board 110 as illustrated in FIG. 3, and thus the back side of the printed circuit board 110 may be fully used. That is, as illustrated in FIG. 3, various circuit elements including the main chip 140 may be surface-mounted on the back side of the printed circuit board 110. Accordingly, both sides of the main board may be efficiently used, making it possible to provide the small-sized main board 100. Furthermore, since all circuit elements including connectors 210-213 are surface-mounted on the printed circuit board 110, production process may be simplified and manufacturing cost may be reduced.

When the video and audio reproduction apparatus 10 starts operating, various components including the display unit 10 and the power supply unit emit heat. In order to cool down the components in the video and audio apparatus 10, air is circulated in the video and audio reproduction apparatus 10. If the size of the main board 100 becomes small as described above, the internal space of the video and audio reproduction apparatus 10 increases, enhancing cooling effect.

Hereinafter, the disposition of the connectors 201-214 and the main chip 140 may be explained in detail.

As described in FIG. 2 and FIG. 4, the first connector area 120 is disposed close to a first edge 111 of the printed circuit board 110, and the second connector area 130 is disposed close to a second edge 112 of the printed circuit board 110 on the opposite side of the first edge 111. Accordingly, the connectors 201-214 may be disposed on the front side of the printed circuit board 110 compactly.

In this case, the internal connection connectors 211-214 may be surface-mounted in the second connector area 130 in a row. The external connection connectors 201-210 may be surface-mounted in the first connector area 120 in a plurality of rows. In the exemplary embodiment of the present invention, the first connector area 120 is divided into a first row 121, a second row 122, and a third row 123 consecutively with reference to the first edge 111. A HMDI input connector 201, a PC data input connector 202, a headphone and an output connector 203 are surface-mounted in the first row 121, a USB connector 204, a component input connector 205, a first audio input connector 206, and a PC audio input connector 207 are surface-mounted in the second row 122, and a tuner 208, a second audio input connector 209, and an optical connector 210 are surface-mounted in the third row 123. However, the disposition of the connectors 201-213 is only an example, and the disposition may be changed depending on the type and the number of connectors mounted on the printed circuit board 110.

As illustrated in FIG. 3 and FIG. 4, the main chip 140 is mounted on the area corresponding to the first connector area 120 in the back side of the printed circuit board 110. Therefore, the size of the printed circuit board 110 does not increase due to the mounting of the main chip 140. This is because the connectors 201-214 are surface-mounted on the front side of the printed circuit board 110 as described above.

If there exist only the first and the second rows 121, 122 of the first connector area 120 without the third row 123 of the first connector area 120, the main chip 140 may be mounted between the first connector area 120 and the second connector area 121, 122 in the back side of the printed circuit board 110.

Since the above structure causes the size of the main board 100 to be reduced greatly, it is desirable to form a more than two pattern layers between the front side and the back side of the printed circuit board 110.

As described above, according to the exemplary embodiment of the present invention, the connectors 201-214 are surface-mounted, and thus both sides of the printed circuit board 110 may be efficiently used and the size of the printed circuit board 110 may be greatly reduced. Before applying the present invention, the size of a printed circuit board was 96 mm in width and 122 mm in length, but after applying the present invention in FIG. 2, the size of the printed circuit board becomes 96 mm in width and 72 mm in length. That is, the size of the printed circuit board 110 has reduced by 40% according to the exemplary embodiment of the present invention.

Figure 5:
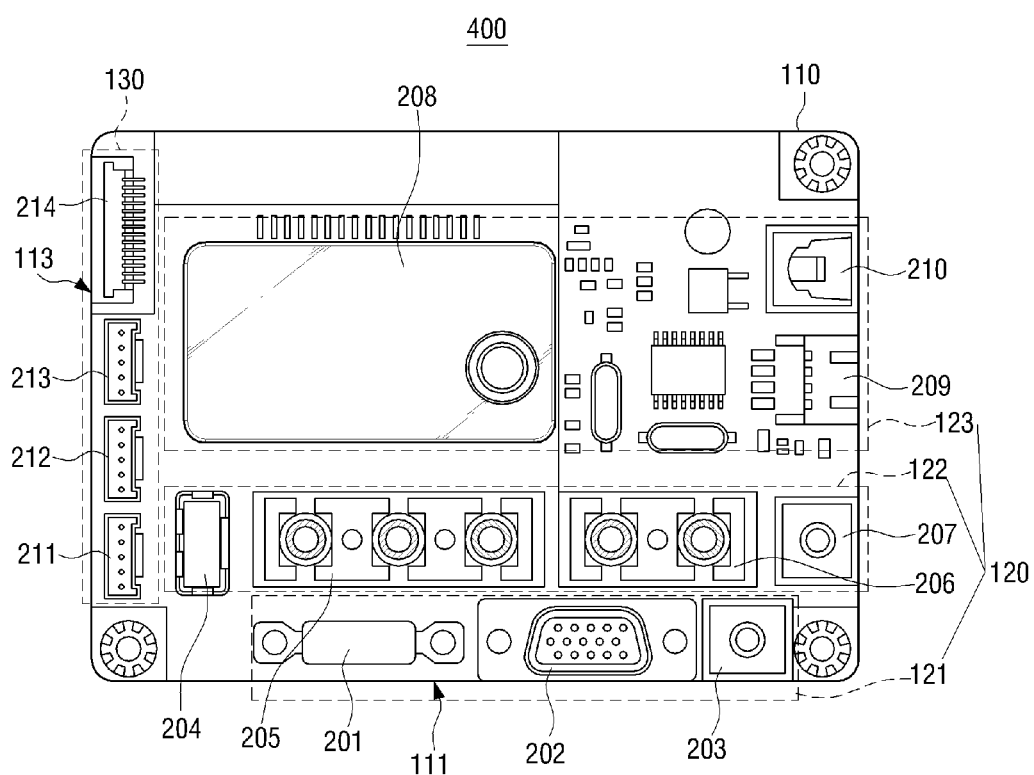
FIG. 5 is a view illustrating the front side of the main board, according to another exemplary embodiment of the present invention.

FIG. 5 is a view illustrating the front side of the main board 400, according to another exemplary embodiment of the present invention. The components which have function and operation similar to the components explained above will be given the same reference numerals and overlapped explanation will not be provided.

Unlike the previous exemplary embodiment of the present invention, the second connector area 130 is disposed close to a third edge 113 of the printed circuit board 110. The third edge 113 is adjacent to the first edge 111 and is not on the opposite side of the first edge 111. The connectors 201-214 are surface-mounted on the first and second connector areas 120, 130 similarly in the previous exemplary embodiment, and thus both sides of the printed circuit board 110 may be efficiently used.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A video and audio reproduction apparatus, comprising:
a display unit configured to display an image;
a speaker unit configured to output audio;
a main board configured to control the display unit and the speaker unit, and is connected to an external apparatus configured to transmit a video signal and an audio signal; and
a power supply unit configured to supply a power to the display unit, a power to the speaker unit, and a power to the main board;
wherein the main board comprises:
a single multi-layered printed circuit board;
a first connector which is disposed on a front surface of the multi-layered printed circuit board, wherein a plurality of external connection connectors are surface-mounted on the first connector for connection with the external apparatus;
a second connector which is disposed on the front surface of the multi-layered printed circuit board, wherein a plurality of internal connection connectors are surface-mounted on the second connector for connection with the display unit, the speaker unit, and the power supply unit; and
a main chip which is electrically connected to the external connection connectors and the internal connection connectors, and is configured to output processed video and processed audio by performing signal processing on the video signal and the audio signal, the main chip being surface-mounted on a back surface of the multi-layered printed circuit board;
wherein the first connector is disposed close to a first edge of the multi-layered printed circuit board and the second connector is disposed close to a second edge of the multi-layered printed circuit board.

2. The video and audio reproduction apparatus as claimed in claim 1, wherein the second edge is an opposite side of the first edge.

3. The video and audio reproduction apparatus as claimed in claim 1, wherein the second edge is adjacent to the first edge.

4. The video and audio reproduction apparatus as claimed in claim 1, wherein the main chip is surface-mounted on an area corresponding to the first connector in the back surface of the multi-layered printed circuit board.

5. The video and audio reproduction apparatus as claimed in claim 1, wherein the main chip is surface-mounted between the first connector and the second connector in the back surface of the multi-layered printed circuit board.

6. The video and audio reproduction apparatus as claimed in claim 1, wherein the internal connection connectors are surface-mounted on the second connector in a row.

7. The video and audio reproduction apparatus as claimed in claim 1, wherein the internal connection connectors comprise at least two of an electrical power connector to receive electricity from the power supply unit, a speaker connector to output a signal-processed audio signal to the speaker unit, and a display interface connector to output a signal-processed video signal to the display unit.

8. The video and audio reproduction apparatus as claimed in claim 1, wherein the external connection connectors are surface-mounted on the first connector in a plurality of rows.

9. The video and audio reproduction apparatus as claimed in claim 1, wherein the external connection connectors comprise at least two of a HMDI input connector, a PC data input connector, a headphone output connector, a USB connector, a component input connector, an audio input connector, a PC audio input connector, a tuner, a second audio input connector, and an optical connector.

10. The video and audio reproduction apparatus as claimed in claim 1, wherein each of a plurality of circuit elements are surface-mounted on the main board.

11. A video and audio reproduction apparatus, comprising:
a display unit configured to display an image;
a speaker unit configured to output audio;
a main board comprising a plurality of circuit elements, the main board configured to receive a video signal and an audio signal provided from an external apparatus, configured to output a signal-processed video signal to the display unit to display the image, and configured to output a signal-processed audio signal to the speaker unit to output the audio; and
a power supply unit comprising a plurality of power supply circuit elements, the power supply unit configured to receive a main power from an outside source and supplying a power to the display unit, configured to supply a power to the speaker unit, and configured to supply a power to the main board,
wherein the main board further comprises:
a single multi-layered printed circuit board having a front surface and a back surface,
an external connection connector module comprising a plurality of connectors which are connected with the external apparatus and are configured to receive the video and the audio signal respectively or simultaneously;
a tuner module configured to receive an external broadcasting signal; and
an internal connection connector module comprising a plurality of connectors to be connected with each of the display unit, the speaker unit, and the power supply unit, and the external connection module and internal connection module are each surface-mounted on the front surface of the single multi-layered printed circuit board,
wherein a main chip, electrically connected with each of the external connection connector module and the internal connection connector module, is surface-mounted on the back surface of the single multi-layered printed circuit board.

12. The video and audio reproduction apparatus as claimed in claim 11, wherein on the single multi-layered printed circuit board, the external connection connector module is surface-mounted on a first connector area close to a first edge,
wherein the internal connection connector module is configured to display the image on the display unit, configured to output the audio on the speaker unit, and configured to supply the power to the display unit, configured to supply the power to the speaker unit and configured to supply the power to the main board;

wherein the internal connection connector module is surface-mounted on a second connector area close to a second edge, the second edge having a different location from the first edge, and wherein the tuner module is surface-mounted between the first connector area and the second connector area.

13. The video and audio reproduction apparatus as claimed in claim 11, wherein the external connection connector module comprises at least two of a HMDI input connector, a PC data input connector, a headphone output connector, a USB connector, a component input connector, an audio input connector, a PC audio input connector, a tuner, a second audio input connector, and an optical connector.

14. The video and audio reproduction apparatus as claimed in claim 11, wherein all of the plurality of circuit elements are surface-mounted on the main board.

15. A video and audio reproduction apparatus, comprising:
a display unit configured to display an image;
a speaker unit configured to output audio;
a power supply unit configured to supply a power to the display unit, a power to the speaker unit, and a power to the main board;
a single multi-layered connection board configured to control the display unit and the speaker unit, connected to an external apparatus configured to transmit a video signal and an audio signal and comprising a front surface and a rear surface disposed opposite from the front surface;
a plurality of connectors divided into a plurality of groups; and
a main processor;
wherein the plurality of connectors comprises:
at least one external connector which is configured to connect to an external device and which is disposed on the front surface of the single multilayered connection board; and
at least one internal connector configured to connect to an internal device, and which is disposed on the front surface of the single multi-layered connection board, and
wherein the main processor electrically connected to the at least one external and internal connectors is disposed on the rear surface of the single multi-layered connection board.

16. The video and audio reproduction apparatus as claimed in claim 15, wherein the at least one external connector is contained within a first group of the plurality of groups and the at least one internal connector is contained within a second group of the plurality of groups.

17. The video and audio reproduction apparatus as claimed in claim 16, wherein the connection board comprises a first edge and a second edge, and the first edge and second edge are disposed across from each other.

18. The video and audio reproduction apparatus as claimed in claim 16, wherein the connection board comprises a first edge and a second edge, and the first edge and second edge are disposed adjacent to each other.

19. The video and audio reproduction apparatus as claimed in claim 17, wherein the first group is disposed closer to the first edge than the second group.

20. The video and audio reproduction apparatus as claimed in claim 18, wherein the first group is disposed closer to the first edge than the second group.

21. The video and audio reproduction apparatus as claimed in claim 1 further comprising a tuner module which receives an external broadcasting signal,
wherein the tuner module is surface-mounted between the first connector area and the second connector area, and
wherein the second edge comprises a different location from the first edge.

22. The video and audio reproduction apparatus as claimed in claim 11, wherein on the single multi-layered printed circuit board, the external connection connector module is surface-mounted on a first connector area close to a first edge,
wherein the internal connection connector module is surface-mounted on a second connector area close to a second edge, the second edge having a different location from the first edge, and
wherein the tuner module is surface-mounted between the first connector area and the second connector area.

23. The video and audio reproduction apparatus as claimed in claim 15 further comprising a tuner module which receives an external broadcasting signal,
wherein the at least one external connector is contained within a first group of the plurality of groups and the at least one internal connector is contained within a second group of the plurality of groups,
wherein the connection board comprises a first edge and a second edge, the second edge having a different location from the first edge,
wherein the first group is disposed close to the first edge of the connection board and the second group is disposed close to the second edge of the connection board, and
wherein the tuner module is surface-mounted between the first group and the second group.

* * * * *